(12) United States Patent
Nakamura et al.

(10) Patent No.: US 6,954,009 B2
(45) Date of Patent: Oct. 11, 2005

(54) POSITIONING APPARATUS

(75) Inventors: Tsuyoshi Nakamura, Kanagawa (JP); Nobuhito Saji, Kanagawa (JP)

(73) Assignee: NSK Ltd., Tokyo (JP)

( * ) Notice: Subject to any disclaimer, the term of this patent is extended or adjusted under 35 U.S.C. 154(b) by 177 days.

(21) Appl. No.: 10/673,437

(22) Filed: Sep. 30, 2003

(65) Prior Publication Data

US 2004/0145119 A1 Jul. 29, 2004

(30) Foreign Application Priority Data

Sep. 30, 2002 (JP) .................................... P2002-284901

(51) Int. Cl.$^7$ ............................................. H02K 41/00
(52) U.S. Cl. ..................... 310/12; 355/73; 250/442.21; 250/492.21
(58) Field of Search ....................... 250/441.11, 442.11, 250/492.21; 29/404, 722; 310/12; 355/53, 72, 75, 76

(56) References Cited

U.S. PATENT DOCUMENTS 4,191,385 A    3/1980   Fox et al.
4,948,979 A  * 8/1990   Munakata et al. ....... 250/492.2
6,846,380 B2 * 1/2005   Dickinson et al. ..... 156/345.31

* cited by examiner

*Primary Examiner*—Darren Schuberg
*Assistant Examiner*—Judson H. Jones
(74) *Attorney, Agent, or Firm*—Sughrue Mion, PLLC

(57) ABSTRACT

In case that some trouble occurs in exhaust pump or in pipe, internal pressure of groove comes closer to atmospheric pressure owing to leak-in of air, because the groove adjoins groove opened to atmospheric air. However, the internal pressures of grooves are maintained at negative value. Thus, difference in pressure between the top and bottom surfaces of moving block is generated. Further, the gap between the moving block and the intermediate block decreases. Consequently, the deterioration in the degree of vacuum in the process chamber can be retarded. During retarded time, measures to protect an object to be processed, such as operation of tightly sealing the object can be taken. Further, in case that the system recovers, time required to operate turbo-molecular pump for sucking the inside of the process chamber is reduced to a short time. Therefore, the processing can be quickly resumed.

10 Claims, 13 Drawing Sheets

POSITIONING APPARATUS

BACKGROUND OF THE INVENTION

1. Field of the Invention

The present invention relates to a positioning apparatus enabled to move a work in, for example, a chamber isolated from external environment.

2. Description of the Related Art

In a semiconductor manufacturing apparatus, a work is processed by being put on a stage and moved in a process chamber, the inside of which is maintained in a vacuum state or in a special gaseous atmospheric state. In the case that a positioning apparatus is provided in the process chamber, there is a fear that lubricant supplied to a moving part thereof may scatter and contaminate the inside of the process chamber.

To solve such a problem, for example, U.S. Pat. No. 4,191,385 discloses an integral negative-pressure-sealed gas-bearing assembly. According to such related art techniques, a moving part enabled to move in two-dimensional directions is provided on a bearing block. Further, a process chamber is formed between the bearing block and the moving part. The process chamber is sealed by a differential pumping seal from external environment. This enables that a work put on the moving part is processed in the process chamber while the process chamber is maintained in negative pressure environment. Consequently, a drive portion for driving a work can be installed outside the process chamber. Thus, the process chamber can be restrained from being contaminated. Moreover, the maintenance of the driving portion is facilitated. U.S. Pat. No. 4,191,385.

Meanwhile, such processing to be performed in a process chamber is applied to a work whose application, for example, fabrication of a semiconductor, requires extremely high precision. Incidentally, an inner surface of a casing may be used as a reference face for processing. However, for instance, when the process chamber is vacuumized, a large force due to the difference in pressure between the inside and the outside of the casing is applied to a casing covering the process chamber, so that minute deformation of the casing occurs. Further, when an opening communicating with the process chamber is made to face the moving block, minute deformation of the moving block itself also occurs, because the inside of the opening is in a vacuum state. In such a case, the deformation of the moving block results in change of the processing reference position serving a reference for processing. Thus, there is a fear that processing cannot be achieved with good accuracy. As a countermeasure against such a problem, it has been devised to suppress the deformation by increasing the thickness of the moving block. However, the increase in the thickness of the moving block causes a new problem in that the entire system gets heavy.

On the other hand, there has been made an attempt to provide a decompression chamber, whose inner pressure is lower than the external pressure of the process chamber, across such a moving block from the process chamber so that the deformation of the moving block is suppressed by bringing the barometric pressure at the side of the process chamber closer to that of the decompression chamber. However, in such a configuration of the system, it is necessary to provide differential pumping seals at both the side of the process chamber and the side of the decompression chamber. Nevertheless, when some trouble occurs at in an exhaust pump for causing the differential pumping seals to operate, and in piping thereof, atmospheric air enters the process chamber P, so that the barometric pressure therein increases. Further, there is a fear that an object being processed may become a defective product.

SUMMARY OF THE INVENTION

It is an object of the invention is to provide a positioning apparatus operable to circumvent or alleviate an influence of the trouble caused in an exhaust system.

To achieve the aforementioned object, according to a first aspect of the invention, there is provided with a positioning apparatus, including:

a process chamber exposed under reduced pressure;

a first casing having a first guide face that has a first opening communicating with inside of the process chamber;

a moving block movable in at least one direction and opposed to said first guide face through a predetermined gap;

a second casing including:

a second guide face being on the other side of the moving block via the moving block, and guiding in a state that the second guide face is opposed to the moving block through a predetermined gap; and a decompression chamber whose internal pressure is lower than a pressure of an outside of the process chamber;

a first differential pumping seal including a plurality of stages, provided between the first casing and the moving block to surround the first opening and sealing between an inside of the process chamber and an outside of said process chamber, wherein a pressure of the outside of the process chamber is higher that that of the inside of the process chamber; and a seal mechanism for maintaining an inside of the decompression chamber at a pressure that is lower than that of an outside of the decompression chamber, wherein a stage of the first differential pumping seal, which is most far from said process chamber, and the inside of the decompression chamber are connected to a same exhaust source.

Incidentally, in the present specification, the number of stages of differential pumping seals is that of differential pressure chambers and so forth on the same face.

The invention is concretely described hereinbelow by being compared with a comparative example. FIG. 1 is a schematic view illustrating the configuration of a positioning apparatus according to the comparative example. As shown in FIG. 1, a moving block 3 is sandwiched by both a guide face 1a of a first casing 1 and a guide face 2a of a second casing 2. The casing 1 has a process chamber P provided therein. The casing 2 has a decompression chamber R provided therein. Gas is exhausted by an associated one of different exhaust pumps from the inside of the process chamber P, and that of the decompression chamber R. On the guide face 1a of the first casing 1, two stages of differential pressure chambers 4 and 5, which respectively constitute differential pumping seals, and a hydrostatic bearing 6 are disposed to surround the process chamber P. On the guide face 2a of the second casing 2, two stages of differential pressure chambers 7 and 8, which constitute a seal mechanism (in this case, second differential pumping seals), and a hydrostatic bearing 9 are disposed in such a manner as to surround the decompression chamber R. That is, the differential pressure chambers 4 and 5 are placed to be symmetrical with the differential pressure chambers 7 and 8. Further, the differential pressure chambers 4 and 7 are connected to a common exhaust pump (that is, an exhaust source, and hereunder, similarly, a common exhaust pump is an exhaust source) P1, while the differential pressure chambers 5 and 8 are connected to a common exhaust pump (that is, an exhaust source) P2.

Further, as illustrated in FIG. 1, valves V are provided between the exhaust pump P1 and each of the differential pressure chambers and between the exhaust pump P2 and each of the differential pressure chambers, respectively. The valves are used for blocking off, when abnormality is detected in the exhaust pump P1 or P2, a gas flow between this exhaust pump and an associated one of the differential pressure chambers. The valves V are driven and controlled by a controller (not shown) through an actuator. Incidentally, for example, a temperature measuring unit system for detecting abnormal overheat in the exhaust pump and cooling water that is used for cooling the exhaust pump, a device for detecting an abnormal increase in load imposed onto a motor, and a pressure gauge for detecting reduction in suction pressure of the exhaust pump are cited as abnormality detecting devices included in the controller (not shown).

Incidentally, when troubles occur in the exhaust pump P1 or in the piping thereof, the valve V associated with the exhaust pump P1 is closed and the exhaust pump P1 is stopped by the controller (not shown). Because there is substantially no pressure difference between the top face and the bottom face of the moving block 3, as viewed in FIG. 1, however, the exhaust pump P2 performs an exhausting operation still, the gap between the moving block 3 and the guide face 1a and the gap between the moving block 3 and the guide face 2a are maintained by the hydrostatic bearings 6 and 9, respectively. Therefore, as compared with a case that the exhaust pumps P1 and P2 are normal, the possibility of infiltration of gas, such as air, blown out of the hydrostatic bearing 6 through the vicinity of the differential pressure chambers 4 and 5 may be enhanced. For instance, there is a fear that oxygen is supplied to an object to be processed and to be prevented from being oxidized. Further, this apparatus has the following trouble. That is, especially, in the case of application using the process chamber P that is in a high vacuum state, when the degree of vacuum is once lowered, it is time-consuming to restore the inside of the process chamber P to the high vacuum state after the trouble is fixed.

Thus, to diversify the risk of occurrences of troubles in the exhaust pumps, it has been considered that the differential pressure chambers 4, 5, 7, and 8 are connected to the exhaust pumps and the piping thereof to be independent of one another. FIG. 2 is a schematic view illustrating another comparative example whose configuration differs from that illustrated in FIG. 1 only in that the differential pressure chambers 4, 5, 7, and 8 are connected to different exhaust pumps P1 to P4, and in that accordingly, the valves to be operated at occurrence of abnormality in the exhaust pumps, as described above, are provided to respectively correspond to the differential pressure chambers.

With the configuration of FIG. 2, when troubles occur in the exhaust pumps P3 and P4, or the piping thereof, a pressure difference is caused between the top face and the bottom face of the moving block 3, as viewed in FIG. 2, so that the gap between the moving block 3 and the guide face 1a is reduced. Thus, the degree of vacuum in the process chamber P is not degraded.

However, when a trouble occurs in the exhaust pump P2 (sucks the inside of the differential pressure chamber 5 provided at a far side from the process chamber P) or in the piping thereof, not only deterioration in the performance of the differential pumping seal simply due to change in the number of stages of the differential exhaust steals from two to one but also the generation of the reverse pressure difference between the top face and the bottom face of the moving block, as viewed in FIG. 2, are caused. This results in increase in the gap between the moving block 3 and the guide face 1a. Thus, there is a fear that the degree of vacuum in the process chamber P becomes lower than the degree thereof in the case where a trouble occurs in the exhaust pump P1, as illustrated in FIG. 1.

In contrast, according to the invention, the aforementioned trouble can be avoided. FIG. 3 is a schematic view illustrating the configuration of the apparatus according to the invention, which differs from the configuration illustrated in FIG. 2 only in that no differential pressure chamber is provided on the guide face 2a of the second casing 2, that the inside of minute gap portion (that is, a labyrinth seal) surrounding the decompression chamber R is directly connected thereto, and that the differential pressure chamber 5, which is placed at a far side from the process chamber P, and the decompression chamber R are connected to the same exhaust pump P2. Incidentally, the differential pressure chamber 4 is connected to the independent exhaust pump P1.

With the configuration illustrated in FIG. 3, when a trouble occurs in the exhaust pump P2 or the piping thereof, the internal pressure of each of the differential pressure chamber 5 and the decompression chamber R becomes closer to atmospheric pressure. However, a pressure of the differential pressure chamber 4 is still maintained at a negative value. Thus, a pressure difference is caused between the top face and the bottom face of the moving block 3, as viewed in FIG. 3. Consequently, the space between the moving block 3 and the guide face 1a decreases. Hence, the deterioration in the degree of vacuum in the process chamber P can be retarded. During a retarded time, countermeasures, such as an operation of tightly sealing the object (by, for instance, being partitioned with a gate valve), can be taken. Further, in the case that the apparatus recovers from a trouble caused in the exhaust pump P2 or in piping thereof, a time required to operate a turbo-molecular pump, which is used for sucking the inside of the process chamber P until a necessary degree of vacuum is realized, is reduced to a short time. Therefore, the processing can be quickly resumed.

According to a second aspect of the invention, there is provided with a positioning apparatus, including:
a process chamber exposed under reduced pressure;
a first casing having a first guide face that has a first opening communicating with inside of the process chamber;
a moving block movable in at least one direction and opposed to said first guide face through a predetermined gap;
a second casing including:
a second guide face being on the other side of the moving block via the moving block, and guiding in a state that the second guide face is opposed to the moving block through a predetermined gap; and
a decompression chamber whose internal pressure is lower than a pressure of an outside of the process chamber;
a first differential pumping seal including a plurality of stages, provided between the first casing and the moving block to surround the first opening and sealing between an inside of the process chamber and an outside of said process chamber, wherein a pressure of the outside of the process chamber is higher than that of the inside of the process chamber; and
a seal mechanism for maintaining an inside of the decompression chamber at a pressure that is lower than that of an outside of the decompression chamber, wherein control device controls the gap between the first guide face and the moving block in accordance with an operating condition of at least one of the first differential pumping seal and the seal mechanism.

FIG. 4 is a schematic view illustrating the configuration according to the invention, which differs from the configuration illustrated in FIG. 2 only in that when a controller 13 detects abnormality of exhaust pump P1 or P2, the controller 13 controls operations of opening and closing valves V1 and V2 through actuators 10 and 11, in addition to operations of stopping the exhaust pump P1 or P2, in which abnormality occurs, and closing the valve V.

With the configuration illustrated in FIG. 4, the controller 13 serving as control device sets the valves V1 and V2 to be in an opened state as compared with the ordinary state. Similarly to the case of the configuration illustrated in FIG. 2, the inside of each of the differential pressure chambers 7 and 8 is brought into a negative pressure condition by an associated one of the exhaust pumps P3 and P4. Incidentally, similarly, the valves V are put into an opened state. Therefore, the inside of each of the differential pressure chambers 4 and 5 is brought into a negative condition by an associated one of the exhaust pumps P1 and P2, so that the gap between the top face of the moving block 3 and the process chamber P and the gap between the bottom face of the moving block 3 and the decompression chamber R are equal to each other. Incidentally, in the case where troubles occur in the exhaust pump P1 or the piping thereof, when the controller 13 detects abnormality of the exhaust pump P1, operations of closing the valve associated with the exhaust pump P1 and stopping the exhaust pump P1 are performed, similarly to the conventional case. Moreover, a predetermined control operation is performed on the setting of the apparatus is controlled so that the internal pressure of the differential pressure chamber 7 or 8 is quickly brought closer to atmosphere pressure than that of the differential pressure chamber 4. Although the internal pressure of the differential pressure chamber 4 gradually becomes close to that of the differential pressure chamber 5 at that time by stopping the exhaust pump P1 and closing the associated valve, the internal pressure of the differential pressure chamber 7 or 8 becomes close to atmosphere pressure earlier than that. Consequently, a pressure difference is caused between the top face and the bottom face of the moving block, as viewed in FIG. 4. Thus, the gap between the moving block 3 and the guide face 1a decreases. Hence, the deterioration in the degree of vacuum in the process chamber P can be retarded. During a retarded time, countermeasures, such as an operation of tightly sealing the object (by, for example, being partitioned with a gate valve) can be taken. The "predetermined control" is performed by the following methods. That is, a first method is to drive both actuators 10 and 11 so that the valves V1 and V2 are simultaneously closed, and then, the exhaust pumps P3 and P4 are stopped. Consequently, first, the internal pressure of the differential pressure chamber 8 reaches atmospheric pressure. Thereafter, the internal pressure of the differential pressure chamber 7 reaches atmospheric pressure. It is sufficient to set this operation timing so that a sum of a rise in the internal pressure of the differential pressure chamber 7 and a rise in the internal pressure of the differential pressure chamber 8 is larger than a rise in the internal pressure of the differential pressure chamber 4. That is, consequently, the pressures on the moving block 3 are set so that the pressure applied on the bottom face is higher than the pressure applied thereon in an ordinary state. Thus, the gap between the moving block 3 and the guide face 1a can be changed to become narrower than the gap between the moving block 3 and the guide face 2a, as compared with the gaps in the ordinary state.

A second method is to drive the actuator 10 to close the valve V1 and then to stop the exhaust valve P3. Consequently, the internal pressure of the differential pressure chamber 8 reaches atmospheric pressure. At that time, similarly to the case of performing the first method, the gap between the moving block 3 and the guide face 1a can be changed to become narrower than the gap between the moving block 3 and the guide face 2a, by setting so that a rise in internal pressure of the differential pressure chamber 8 is faster than a rise in internal pressure of the differential pressure chamber 4.

In a third method, the actuator 11 is driven to close the valve V2 and then the exhaust pump P4 is stopped, and simultaneously supply gas (for instance, dry air, or inactive gas, such as nitrogen gas) to the differential pressure chamber 7 to thereby rapidly raise the internal pressure of the differential pressure chamber 7 to atmospheric pressure. Alternatively, gas maybe supplied to the differential pressure chamber 8, or to both the differential pressure chambers 7 and 8. In these cases, similarly to the case of the first method and the second method, the gap between the moving block 3 and the guide face 1a can be changed to become narrower than the gap between the moving block 3 and the guide face 2a. Especially, the internal pressures of the differential pressure chamber 7 and/or 8 can more rapidly be raised to atmospheric pressure by supplying gas to the differential pressure chamber 7 and/or 8.

Next, a description is given to a case that a trouble occurs in the exhaust pump P2 or in the piping thereof. In this case, similarly, the controller 13 basically controls the apparatus so that the gap between the moving block 3 and the guide face 1a can be changed to become narrower than the gap between the moving block 3 and the guide face 2a. Incidentally, when the valve associated with the exhaust pump P2 is closed, and the exhaust pump P2 is stopped, the internal pressure of the differential pressure chamber 5 is raised to atmospheric pressure, with the result in slight increase in the internal pressure of the differential pressure chamber 4. Therefore, a raise in a sum of internal pressures of the differential pressure chambers provided in the guide face 2a, which is sufficient for overcoming the raise in a sum of raises in the internal pressures of the differential pressure chambers 4 and 5, is needed. That is, while the valve V associated with the the exhaust pump P2 is closed and the the exhaust pump P2 is stopped, the controller 13 performs a predetermined control operation so that a sum of raises in the internal pressures of the differential pressure chambers 7 and 8 is larger than the sum of the raises in the internal pressures of the differential pressure chambers 4 and 5.

The "predetermined control" operation is, for example, the first method, or the method of performing the supply of gas to both the differential pressure chambers 7 and 8 (together with the closing of the valves V1 and V2 and the stoppage of the exhaust pumps P3 and P4) among three modes included in the third method. The latter method is more preferable in view of the respect that the gap between the moving block 3 and the guide face 1a can quickly be narrowed. According to the invention, the number of stages of the differential pumping seals is not limited to two. The number of stages thereof may be one, three or more.

Further, although the exhaust pumps P1 to P4 are connected to the four differential pressure chambers 4, 5, 7, and 8 independent of one another in the case of the example illustrated in FIG. 4, the invention is not limited thereto. The sharing of an exhaust pump between the differential pressure chambers 4 and 5, and/or the sharing of an exhaust pump between the differential pressure chambers 5 and 8 may be adopted.

In this case, an example of the sharing of an exhaust pump between the differential pressure chambers 4 and 7 is given hereinbelow. That is, a pipe extended from this exhaust pump through the valve V is then branched into branch pipes, one of which is directly connected to the differential pressure chamber 4, and the other of which is connected to the differential pressure chamber 7 via valve V2. This valve V is closed when a trouble occurs in the shared exhaust pump. The valve V2 is closed by the actuator 11 in the case that a trouble occurs in the exhaust pump P2 associated with the differential pressure chamber 5.

Furthermore, in this case, when the controller 13 detects an occurrence of a trouble in this shared exhaust pump, the valve V associated with this shared exhaust pump is closed, and this shared exhaust pump is stopped. In addition, the valve V1 associated with the differential pressure chamber 8 is closed by being driven by the actuator 10. The exhaust pump P3 is stopped. Furthermore, the valve V2 is closed by being driven by the actuator 11. Consequently, the apparatus is put into a situation similar to the situation caused in the case where the trouble occurring in the exhaust pump P1, as illustrated in FIG. 4, is dealt with by performing the first method. When a trouble occurs in the exhaust pump P2 associated with the differential pressure chamber 5, the valve V associated with the exhaust pump P2 is closed. Further, the exhaust pump P2 is stopped. Moreover, the valves V1 and V2 are closed by being driven by the actuators 10 and 11. Furthermore, the exhaust pump P3 associated with the differential pressure chamber 8 is stopped. In these cases, the gap between the moving block 3 and the guide face 1$a$ can rapidly be narrowed by closing the valve V1 or V2 and supplying gas to both or one of the differential pressure chambers 7 and 8.

In the case of sharing an exhaust pump by the differential pressure chambers 5 and 8, similarly, a pipe extended from this shared exhaust pump through the valve V is then branched into branch pipes, one of which is directly connected to the differential pressure chamber 5, and the other of which is connected to the differential pressure chamber 8 via valve V1. This valve V associated with this shared exhaust pump is closed when the controller 13 detects a trouble occurring in the shared exhaust pump. Further, this shared exhaust pump is stopped. Moreover, the valve V2 associated with the differential pressure chamber 7 is closed by being driven by the actuator 11. The exhaust pump P4 is stopped. In the case that a trouble occurs in the exhaust pump P1 associated with the differential pressure chamber 4, the valve V associated with the exhaust pump P1 is closed, and the exhaust pump P1 is stopped. Moreover, the valve V1 associated with the differential pressure chamber 8 is closed by being driven by the actuator 10. Furthermore, the exhaust pump P3 is stopped. Alternatively, in addition, the valve V2 associated with the differential pressure chamber 7 is closed. Further, the exhaust pump P4 is stopped. Further, according to circumstances, it is preferable to suitably supply gas to both or one of the differential pressure chambers 7 and 8, similarly to the aforementioned case.

Although detailed description is omitted herein, even in the case of sharing an exhaust pump by the differential pressure chambers 4 and 7, and of sharing an exhaust pump by the differential pressure chambers 5 and 8, the apparatus is constituted on the basis of a similar idea. Even when a trouble occurs in any one of the exhaust pumps, the gap between the moving block 3 and the guide face 1$a$ can rapidly be narrowed by appropriately controlling the apparatus. Furthermore, the number of the differential pressure chambers provided at the side of the decompression chamber may be, for instance, one. Further, the exhaust pump associated with the differential pressure chamber 4 may be shared for exhausting gas from the inside of the decompression chamber.

Incidentally, after the valves V, V1, and V2 are closed, it is desired for reducing a load to immediately stop the associated exhaust pumps P1, P2, P3, and P4 (it is the same with embodiments (to be described later)).

Furthermore, in the case where an external atmosphere is sufficiently clean and low in humidity, the valves V1 and V2 may have the function of opening the inside of the piping, through which the seal mechanism (that is, the second differential seal in this case) is connected to the exhaust source, to atmosphere according to the operating conditions of the first differential pumping seal or the seal mechanism (that is, the differential pumping seals 4, 5, 7, and 8). Incidentally, in the case of sharing the exhaust pump by the differential pressure chambers 4 and 7 (or the exhaust pump by the differential pressure chambers 5 and 8), the inside of the piping is opened to atmosphere at a side closer to the differential pressure chamber 7 (or the differential pressure chamber 8) rather than the valve V2 (or the valve V1).

Further, the number of stages of first differential pumping seals is two or more. The number of stages of differential pumping seals of the seal mechanism (the second differential pumping seal in this case) is one. Further, a minute gap portion is provided at the side of the decompression chamber R, that is, at the side of the guide face 2$a$. Alternatively, one of the first differential pumping seals, which is far most from the process chamber, and the decompression chamber R may be connected to the same exhaust source in the former case. Further, in the latter case, one of the first differential pumping seals, which is far most from the process chamber, and the second differential pumping seal may be connected to the same exhaust source. Similarly, the chambers provided on the near side may be connected to each other (corresponding to the case of sharing the exhaust pump P1 by the chambers and also sharing the exhaust pump P4 by the chambers, as illustrated in FIG. 4).

Further, although the controller 13 serving as the control device controls the internal pressure of the differential pressure chamber at the side of the decompression chamber R or the pressure of the decompression chamber R in the aforementioned example to increase, thereby to narrow the gap at the side of the guide face 1$a$. Instead of this, the air discharging pressure of the hydrostatic bearings 6 and 8 may be adjusted therefor. That is, when a trouble occurs in an exhaust pump associated with the differential pressure chamber 4 or 5, the associated valve is closed, and the associated exhaust pump is stopped. Moreover, the controller 13 may adjust the apparatus so that an air supply pressure for supplying air to the hydrostatic bearing 9 increases. Alternatively, the controller 13 may adjust the apparatus so that an air supply pressure for supplying air to the hydrostatic bearing 6 decreases. Needless to say, the controller 13 may adjust the apparatus so that an air supply pressure for supplying air to the hydrostatic bearing 9 increases, and that an air supply pressure for supplying air to the hydrostatic bearing 6 decreases. Furthermore, this may be combined with the apparatus according to the first or second aspect of the invention.

Although air is discharged and the moving block 3 is supported from both sides thereof by the hydrostatic bearings 6 and 9, the moving block 3 may be supported by, for example, magnetic bearings, instead of the hydrostatic bearings, with respect to the first casing 1 or the second casing 2. The use of such magnetic bearings is preferable, because of the fact that in the case that such magnetic bearings are used, the gaps respectively provided on the top surface and the bottom surface of the moving block 3 can be adjusted by appropriately lowering the performance of the bearings according to electric power supplied to the magnetic bearings.

Furthermore, the apparent thickness of the moving block 3 may be changed under the control of the controller 13 serving as the control device. Concretely, for example, the moving block is divided into two parts in the direction of thickness thereof. Then, an appropriate number of piezoelectric elements each enabled to expand and contract in the direction of thickness of the moving block 3 are made to intervene between the parts. Further, when a trouble occurs in the exhaust pump associated with the differential pressure chamber 4 or 5, the associated valve V is closed, and the exhaust pump is stopped. Moreover, the controller 13 supplies a predetermined voltage to the piezoelectric elements to bring the piezoelectric elements into a state in which the piezoelectric elements are extended a predetermined amount. Thus, the apparent thickness of the moving block 3 is increased. Consequently, the gap between the moving block 3 and the guide face 1a can be narrowed. In addition, there has been provided another method, by which for example, the apparatus may be provided with device for heating the moving block 3 to a predetermined temperature, so that the gap therebetween can be adjusted by thermal expansion.

Each of the aforementioned control device can be used for temporarily reducing the gap between the moving block 3 and the guide face 1a, alternatively, for bringing both the moving block 3 and the guide face 1a into intimate contact with each other, in addition to the case for dealing with troubles generated in the exhaust pump. For instance, the apparatus according to the invention has an advantage in that processing time and the number of necessary exhaust pumps can be reduced by eliminating the gap therebetween until the degree of vacuum in the process chamber P reaches a predetermined level.

The term "differential pumping seal" used in the present specification designates, for example, a seal that keeps atmospheres of both sides of the minute space between two opposed surfaces (for example, atmospheric pressure and high vacuum) in non-contact state by discharging an air through a differential pressure chamber provided between the two opposed surfaces. In the following description of embodiments, a member having an exhaust face is referred to as a differential pumping seal. Further, the term "labyrinth seal" designates a member that serves to maintain atmospheres provided on both sides in a certain state by directly discharging gas from the decompression chamber constituting one of both sides, on which atmosphere is provided, without providing a differential pressure chamber between two opposed surfaces, which face each other through a minute gap.

DESCRIPTION OF THE PREFERRED EMBODIMENTS

Figure 1:
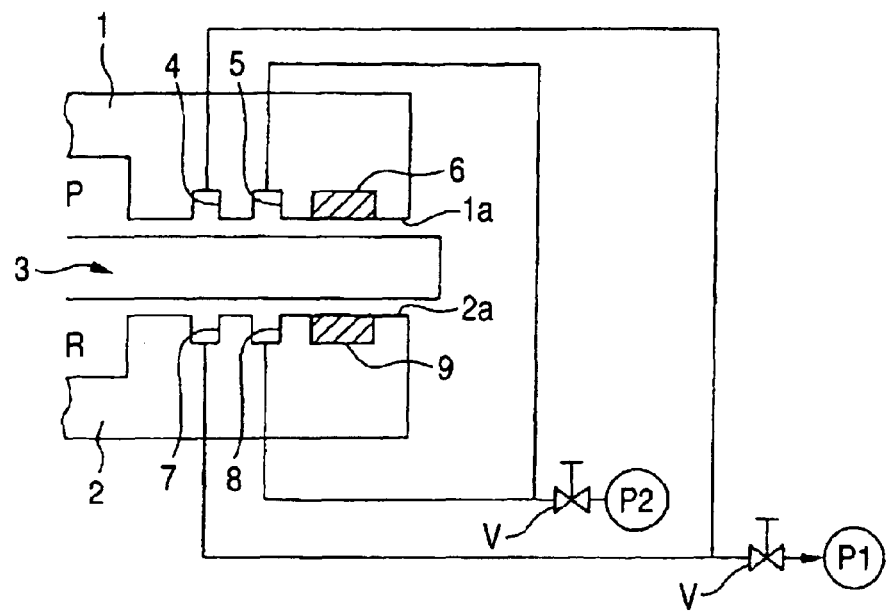
FIG. 1 is a schematic view illustrating a configuration of a positioning apparatus according to a comparative example.
Figure 2:
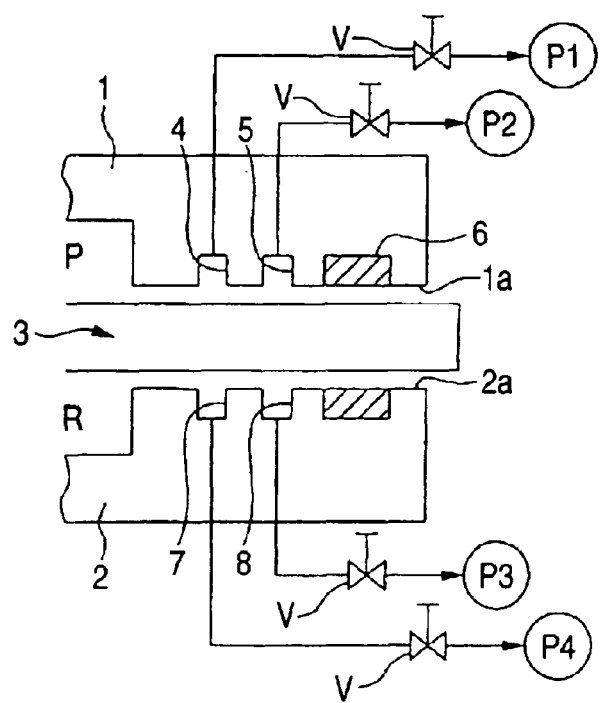
FIG. 2 is a schematic view illustrating a configuration of a positioning apparatus according to another comparative example.
Figure 3:
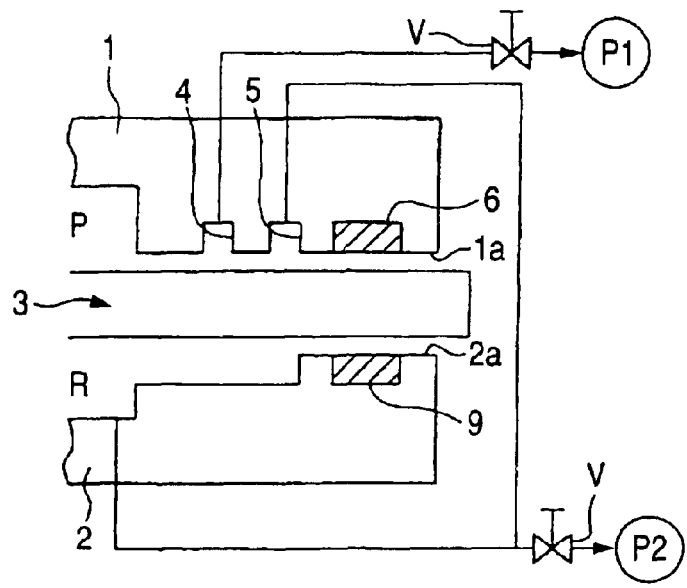
FIG. 3 is a schematic view illustrating the configuration of a positioning apparatus according to the first aspect of the invention.
Figure 4:
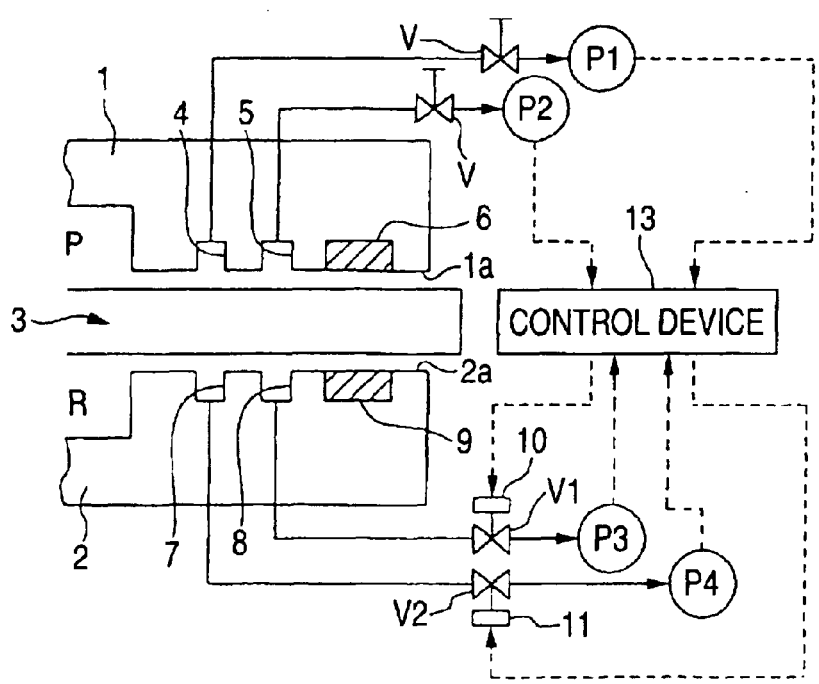
FIG. 4 is a schematic view illustrating a configuration of a positioning apparatus according to the second aspect of the invention.
Figure 5:
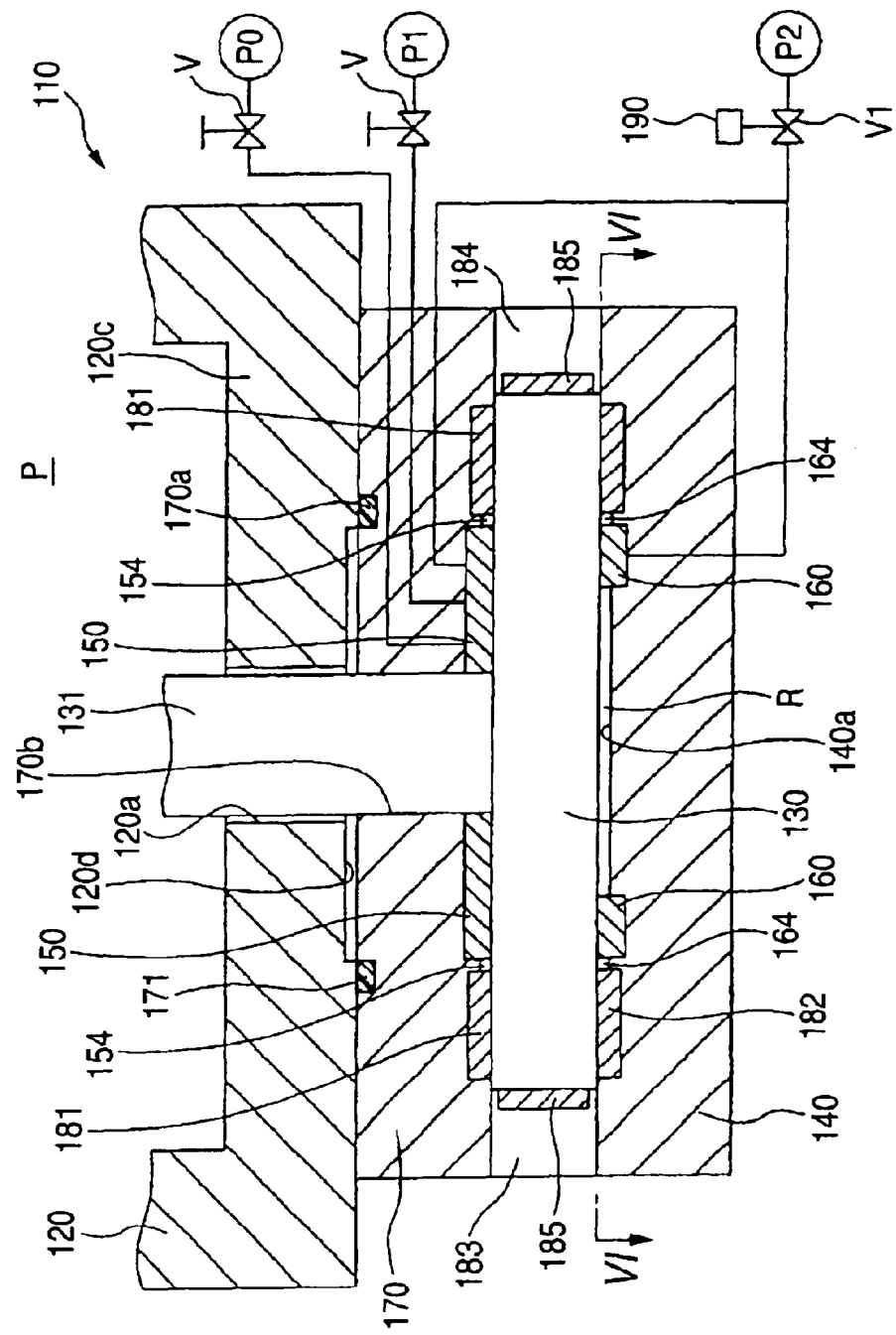
FIG. 5 is a front sectional view illustrating a positioning apparatus 110 according to a first embodiment of the invention.
Figure 6:
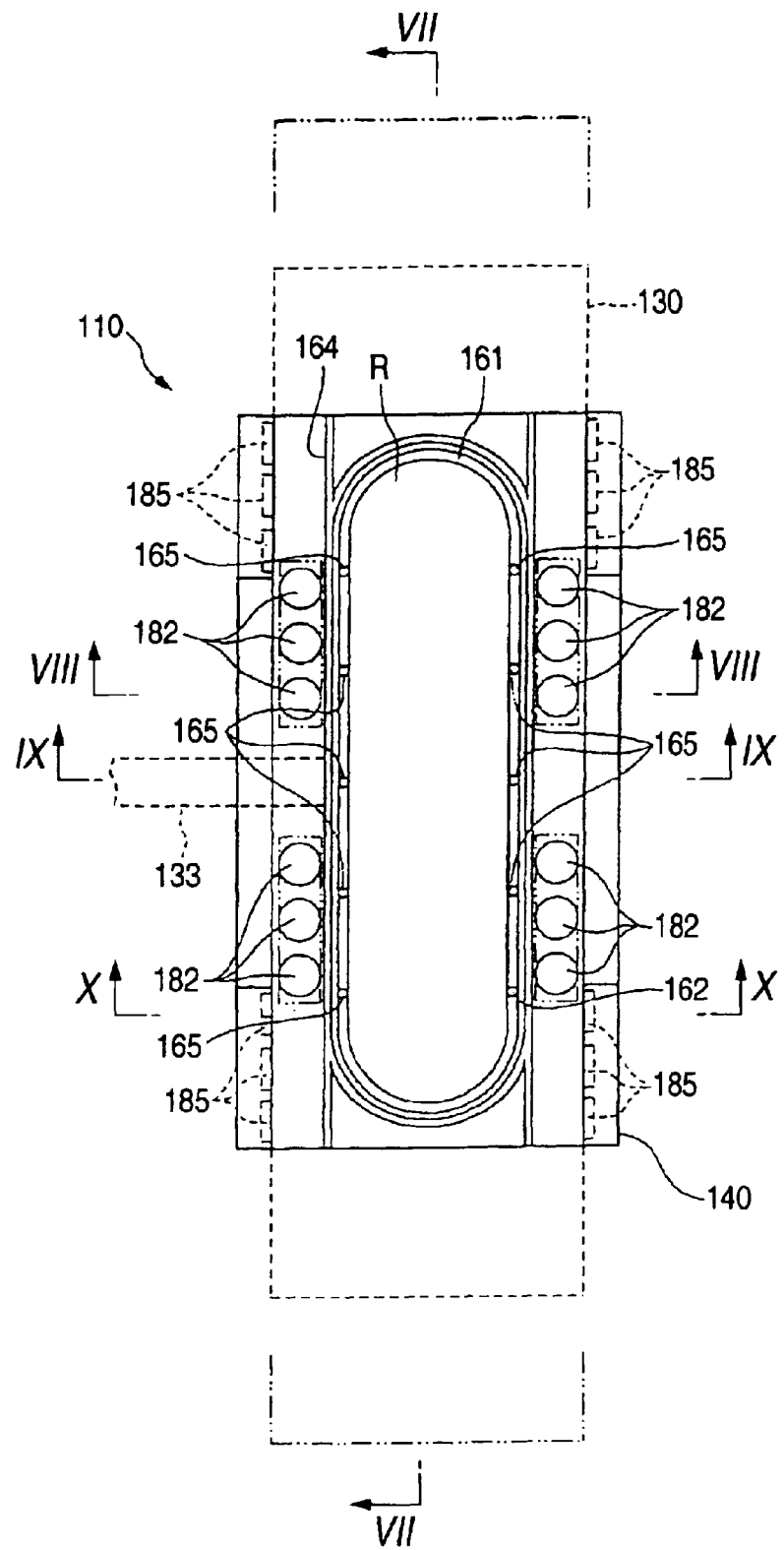
FIG. 6 is a sectional view of the positioning apparatus 110 taken in the direction of arrows on line VI—VI of FIG. 5.
Figure 7:
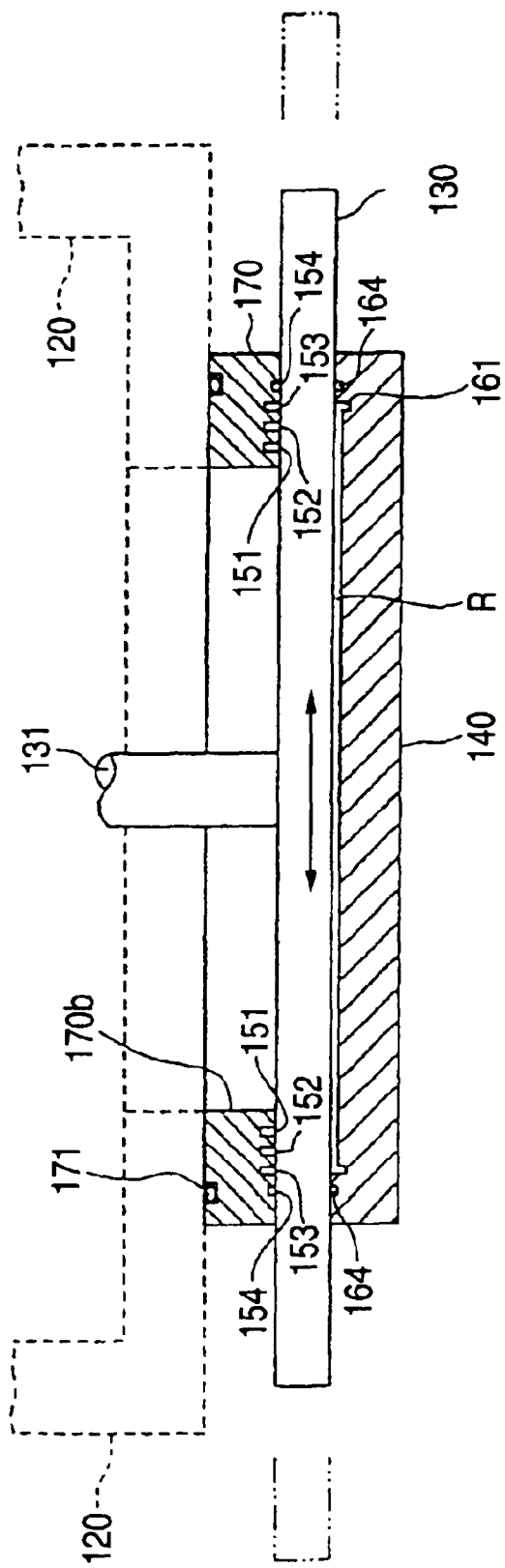
FIG. 7 is a sectional view of the positioning apparatus 110 taken in the direction of arrows on line VII—VII of FIG. 6.
Figure 8:
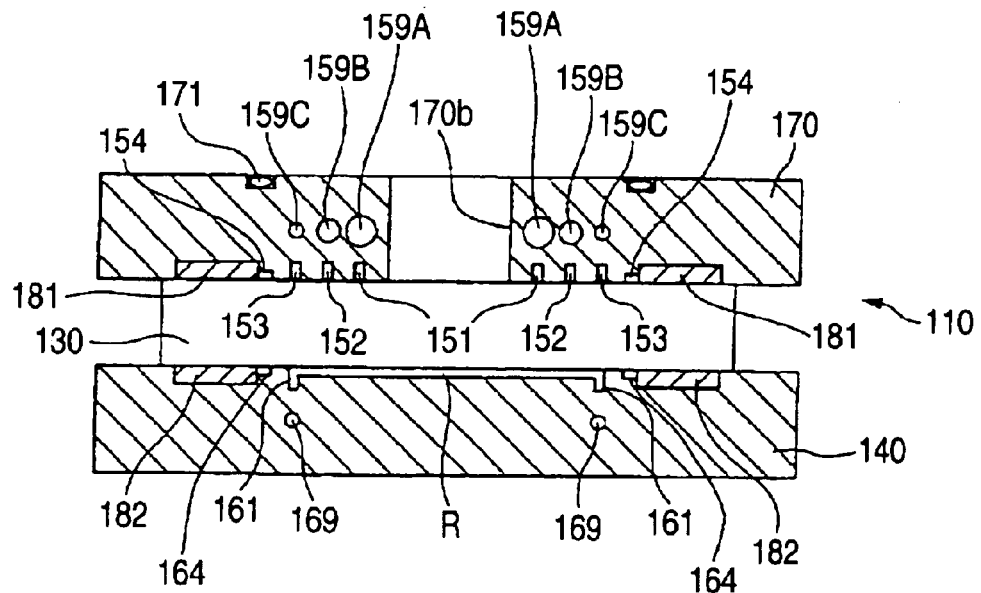
FIG. 8 is a sectional view of the positioning apparatus 110 taken in the direction of arrows on line VIII—VIII of FIG. 6.
Figure 9:
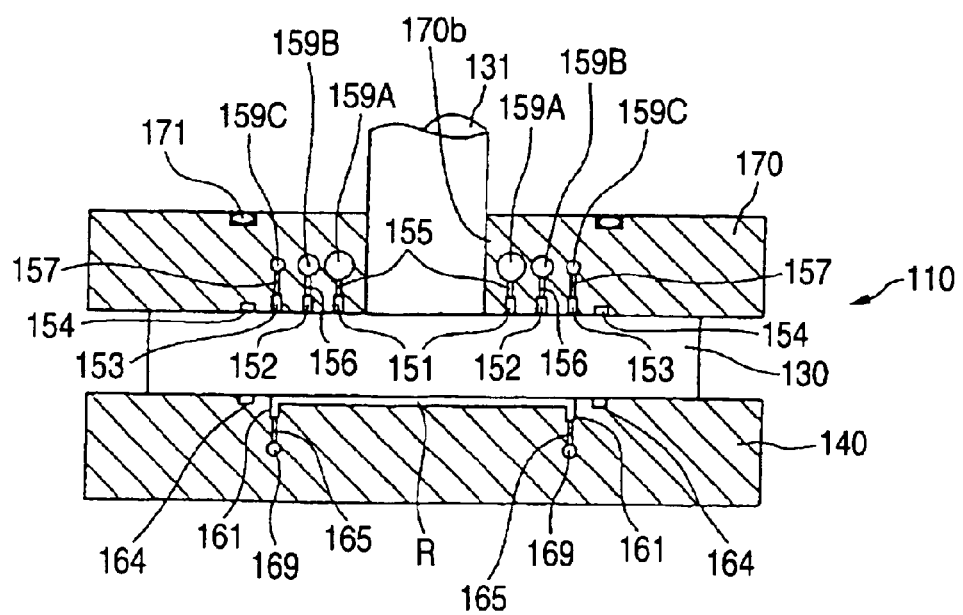
FIG. 9 is a sectional view of the positioning apparatus 110 taken in the direction of arrows on line IX—IX of FIG. 6.
Figure 10:
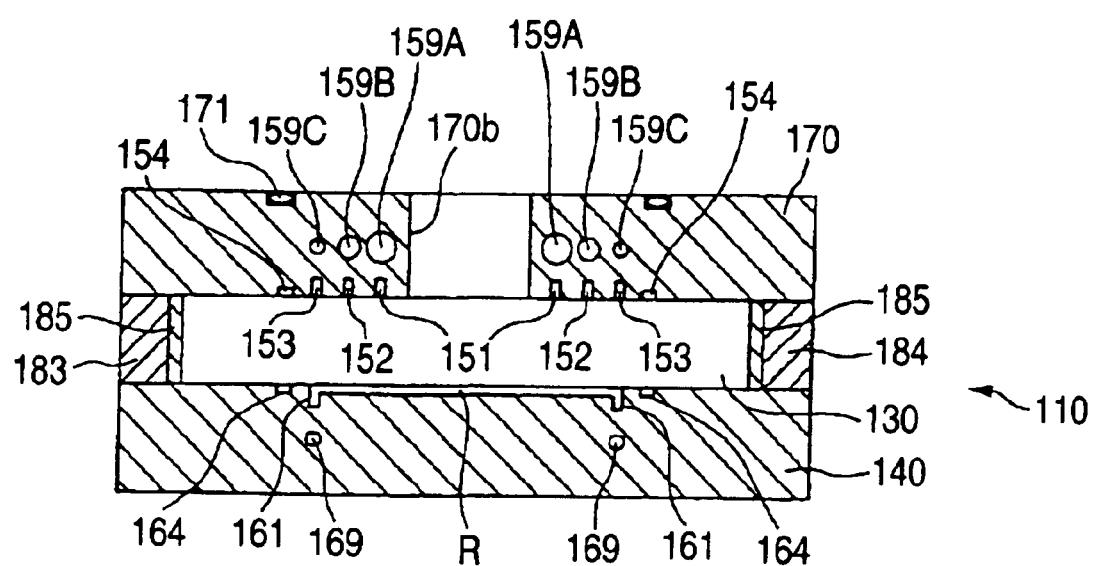
FIG. 10 is a sectional view of the positioning apparatus 110 taken in the direction of arrows on line X—X of FIG. 6.

Hereinafter, preferred embodiments of the invention are described with reference to the accompanying drawings. FIG. 5 is a front sectional view of a positioning apparatus 110 according to a first embodiment of the invention, and shows this embodiment by omitting an upper part of sealed casing and simplifying the differential pumping seal and the hydrostatic bearing. FIG. 6 is a sectional view of the positioning apparatus 110 taken on line VI—VI of FIG. 5 in the direction of arrows. FIG. 7 is a sectional view of the positioning apparatus 110 taken on line VII—VII of FIG. 6 in the direction of arrows. Each of FIGS. 8 to 10 is a sectional view of the positioning apparatus 110 taken on an associated one of lines VIII—VIII, IX—IX, and X—X of FIG. 6 in the direction of arrows.

As illustrated in FIG. 5, the positioning apparatus 110 according to this embodiment has a first casing 120, which contains a process chamber P and has an opening 120a linking the process chamber P with the outside thereof, a moving block 130 placed to face the opening 120a of the first casing 120, an intermediate block 170 (constituting a part of the first casing) sandwiched between the first casing 120 and the moving block 130, and a second casing 140 disposed across the moving block 130 from the first casing 120 (or the intermediate block 170). The inside of the process chamber P is sucked by a pump (not shown), and put into a negative pressure state. Incidentally, the intermediate lock 170 and the second casing 140 are connected to each other through bearing blocks 183 and 184. In such a state, the moving block 130 is constrained by these constituent elements through predetermined gaps, and enabled to slide in a direction perpendicular to paper on which FIG. 5 is drawn.

As shown in FIGS. 5, and 8 to 10, the top surfaces of both sides of the moving block 130 are supported by hydrostatic bearings 181 (whose bottom face is the first guide face) through predetermined gaps with respect to the intermediate block 170. The bottom surfaces of both sides of the moving block 130 are supported by hydrostatic bearings 182 (whose top face is the second guide face) with respect to the second casing 140 through predetermined gaps. Both the side surfaces of the moving block 130 are supported by hydrostatic bearings 185 provided on bearing blocks 183 and 184. Therefore, the moving block 130 is enabled to slide in a direction perpendicular (that is, upward-downward direction, as viewed in FIG. 6) to paper on which FIG. 5 is drawn. Incidentally, in this embodiment, the hydrostatic bearings 181, 182, and 185 are each constituted by a nearly cylindrical porous graphite member. The bearing face is fixed to be flush with the intermediate block 170, the casing 140, or the bearing blocks 183 and 184. Air is supplied to the hydrostatic bearings 181, 182 and 185 through an air supply path (not shown).

A differential pumping seal 150 adjoins the hydrostatic bearing 181 and tightly seals the space between the top face of the moving block 130 and the intermediate block 170, which is provided at the inward side of the bearings 181. A labyrinth seals 160 adjoins the hydrostatic bearing 182 and tightly seals the space between the bottom face of the moving block 130 and the second casing 140, which is provided at the inward side of the bearings 182. The hydrostatic bearings 181, 182, and 185 can support an opposed face to be brought into non-contact therewith by utilizing air pressure-fed from a pump (not shown).

A differential pressure chamber 151 provided in the differential pumping seal 150 is connected to the exhaust pump P0. A differential pressure chamber 152 is connected to an exhaust pump P1. The differential pressure chambers 151 and 152 are sucked, so that the internal pressure thereof is negative A differential pressure chamber 153 of the differential pumping seal 150, which is provided near to the hydrostatic bearing 181, and an exhaust path constituting the labyrinth seal 160 are connected to a common exhaust pump P2. The inside of the differential pressure chamber 153 and the exhaust path are sucked by the pump P2, so that the internal pressure of the differential pressure chamber 153 and the exhaust path becomes negative. Incidentally, a valve V, which is driven by an actuator (not shown) under the control of control device (not shown), and a valve V1, which is driven by an actuator 190 under the control of the control device, are disposed in the piping, which links with each of the exhaust pumps P1, P2, and P0. Incidentally, a groove 154, which is provided between the hydrostatic bearing 181 and the differential pumping seal 150, and a groove 164, which is provided between the hydrostatic bearing 182 and the labyrinth seal 160, are maintained at atmospheric pressure, as will be described later.

The casing 120 supported on a bed (not shown) has a bottom wall 120c, in which an elongated opening (that is, a first opening) 120a is formed. As shown in FIG. 5, an oval and shallow countersunk portion 120d is formed in the bottom face of the bottom wall 120c of the casing 120. A groove portion 170a is formed in the top face of the intermediate block 170 facing the bottom wall 120c to extend along the periphery of the countersunk portion 120d. In the groove portion 170a, an O-ring 171 is placed. The O-ring 171 abuts against the bottom face 120c of the casing 120 and seals the space between the intermediate block 170 and the bottom wall 120c. Incidentally, although not clearly shown in FIG. 5, a gap is provided between the bottom wall 120c of the casing 120 and the top face of the intermediate block 170 in the outer periphery of the groove portion 170a. This outer peripheral gap is about 0.1 mm. This gap serves to maintain a state in which the top face of the intermediate block 170 is in no contact with the bottom face of the bottom wall 120c.

An oval opening 170b is formed in the central portion of the intermediate block 170. A shaft 131 extends in such a manner as to penetrate through such an opening 170b, and the opening 120a of the first casing 120 without contacting with these openings. The shaft 131 is integrally formed on the top face of the moving block 130.

The process chamber P provided in the first casing 120 does not communicate with the decompression chamber R constituted by the second casing 140, the moving block 130, and the labyrinth seal 160, except minute gaps among members. A part, at which the decompression chamber R faces the bottom face of the moving block 130, is a recess portion 140a. Incidentally, the moving block 130 is connected to a drive portion (not shown) through a connecting portion 133 (see FIG. 6) provided to penetrate through a portion (that is, a side opening in a transversal direction of the moving block 130) in which no part of a bearing block 183 is present. For instance, a combination of a motor and a lead screw, such as a ball screw, a combination of a motor, belt, and a pulley, or a linear motor may be used as the drive portion. Further, instead of or in addition to the static baring 185, an ultrasonic motor (not shown) being capable of driving the moving block 130 with respect to the second casing 140 is provided at a stationary portion in such a manner as to face the side opening portion. This motor may be employed as the drive portion. Furthermore, a connecting portion is provided at an end in the longitudinal direction of the moving block 130. The drive portion may be connected thereto through this connecting portion, instead of providing the connecting portion 133. In this case, the side portion opening may be shielded.

As illustrated in FIG. 6, the exhaust mechanism of the labyrinth seal 160 consists of a track-like groove 161 formed along the periphery of the oval decompressions chamber R, which is formed in the top face of the second casing 140, a communicating hole 165 communicating therewith, and an exhaust hole 169. As shown in FIG. 6, the groove 164 surrounding the decompression chamber R extends in both sides in a direction of a tangent line and is opened to atmosphere at both end faces of the second casing 140. As shown in FIGS. 6 and 9, a communicating hole 165 is formed (such a groove may be disposed in other places) in such a manner as to extend from the bottom of the groove 161 toward the inside of the second casing 140. As shown in FIGS. 8 to 10, the communicating hole 165 communicates with the exhaust hole 169 that extends in the longitudinal direction of the second casing 140. The exhaust hole 169 has both ends that are placed outside the second casing 140 and connected to the exhaust suction pump P2 shown in FIG. 5.

The differential pumping seal 150 consists of grooves 151, 152, 153, which constitute a differential pressure chamber, exhaust holes 159A, 159B, and 159C, and communicating holes 155, 156, and 157, each of which links such opposed elements with each other, as shown in FIG. 9. Four grooves 151 to 154 extend like tracks along the periphery of the elongated hole of the intermediate block 170. Among the grooves, the groove 154 extends along both sides in the direction of the tangent line and is opened to atmosphere air at both end faces of the intermediate block 170. Plural communicating holes 155 to 157 are formed to extend from each of the grooves 151 to 153 toward the inside of the second casing 140. As shown in FIGS. 8 to 10, these communicating holes communicate with six exhaust holes 159A, 159B, and 159C that extend in the longitudinal direction in the intermediate block 170. The exhaust holes 159A, 159B, and 159C each have both ends placed outside the intermediate block 170. The exhaust hole 159A is connected to the exhaust pump P0. The exhaust hole 159B is connected to the exhaust pump P1. The exhaust hole 159C is connected to the exhaust pump P2. It is most preferable that gas in the exhaust holes 159A, 159B, and 159C, that is, gas in the differential pressure chambers 151, 152, and 153 is exhausted by different exhaust pumps, respectively. However, the exhaust pump P0 may be omitted by connecting the exhaust holes 159A and 159B to the exhaust pump P1, and connecting the exhaust hole 159C to the exhaust pump P2, alternatively, by connecting the exhaust holes 159A to the exhaust pump P1, and connecting the exhaust holes 159B and 159C to the exhaust pump P2. In short, it is sufficient that at least the outermost differential pressure chamber 153 and the decompression chamber R use a common pump. Incidentally, preferably, each of the exhaust holes 159A, 159B, and 159C increases in diameter toward the inside of the intermediate block 170 (that is, toward the opening 140a), as illustrated in FIGS. 8 to 10.

Next, an operation of the positioning apparatus 110 according to this embodiment is described hereinbelow. A driving force of a drive source (not shown) is transmitted through the connecting member 133 to the moving block 130. Thus, the shaft 131 moves integrally therewith. A work (not shown) put on a table attached to the top end of the shaft 131 can be positioned at any place within a range in which the shaft 131 can move in the first casing 120.

According to this embodiment, in the case that a trouble occurs in the exhaust pump P2 or in the piping thereof, and that abnormality is detected, the controller (not shown) causes the valve V1 to be closed, and also causes the exhaust pump P2 to stop. Thus, because the groove 153 adjoins the groove 154 opened to atmosphere air, the internal pressure of the groove 153 becomes close to atmospheric pressure owing to leak-in of air. However, according to this embodiment, simultaneously with this, the internal pressure of the groove 161, thus, the internal pressure of the decompression chamber R comes close to atmospheric pressure. On the other hand, each of the exhaust pumps P1 and P0 functions, so that each of the internal pressures of the grooves 151 and 152 is still maintained at a negative value. Consequently, a pressure difference is caused between the top face and the bottom face of the moving block 130, as viewed in FIG. 5. In the case of a large scale apparatus, a sucking force of nearly 1 t is generated. Thus, the gap between the moving block 130 and the intermediate block 170 is decreased. Consequently, the deterioration in the degree of vacuum in the process chamber P can be retarded. During the retardation, countermeasures, such as an operation of tightly sealing the object (by, for example, being partitioned with a gate valve), can be taken.

Incidentally, in the case that a trouble occurs in the exhaust pump or in the piping thereof, when a pressure difference is generated between both the surfaces of the moving block 130, there is a fear that the moving block 130 may come in contact with the hydrostatic bearings 181, 182, and 185 owing to deformation thereof. Such a drawback can be avoided by enhancing the stiffness of the moving block 130 somewhat.

Further, the control device (not shown) detects an occurrence of a trouble in the exhaust pump P2 or the piping thereof, the actuator 190 illustrated in FIG. 9 is driven, and the valve V1 is closed. Thus, the pressure difference between the top face and the bottom face of the moving block 130 can slowly be generated, as viewed in FIG. 5. When a trouble occurs in the exhaust pump, it is necessary for restraining deterioration in guide accuracy due to change of supporting conditions by the guide member and for suppressing interference among members due to deformation of the guide that the positioning apparatus is emergently stopped. However, the apparatus according to the invention can sufficiently serve as what is called an interlock device for gradually increasing the internal pressure of the process chamber from a vacuum to atmospheric pressure, to thereby enable an operator to take an appropriate measure.

Incidentally, although air in the decompression chamber R is exhausted through a plurality of communicating holes 165 communicating with the groove 161, air may be exhausted from the decompression chamber R through a large-diameter exhaust hole directly communicating with the decompression chamber R. Further, in the case that the hydrostatic bearings 181 and 182 have sufficient supporting stiffness against the sucking force of the differential pumping seal, the aforementioned advantages may be difficult to obtain, because an amount of change in the gap between the moving block 130 and the intermediate block 170 is minute. In such a case, the apparatus may be enabled to adjust the air discharge pressure of the hydrostatic bearing 181. Then, the air discharge pressure of the hydrostatic bearing 181 is reduced in response to a trouble caused in the exhaust pump. Thus, the gap between the moving block 130 and the intermediate block 170 can rapidly be decreased.

Air supply path to hydrostatic bearing 181 may be divided into two paths. The one of the air supply path is connected to a positive pressure pump, the other air supply path is connected to exhaust pump. The divided air supply path is normally connected to the positive pressure pump, but when it is abnormally, the divided air supply path may change to connect to the exhaust pump. Accordingly, when the trouble is occurred, the moving block 130 and the intermediate block is able to closely contact with each other. This situation will be explained later by referring to FIG. 14.

Alternatively, instead of the hydrostatic bearing, a magnetic bearing, whose ability can be adjusted according to a voltage supplied from an external circuit is employed. Then, the apparatus may be adapted so that the gap between the moving block 130 and the intermediate block 170 can quickly be reduced by lowering a supply voltage to the magnetic bearing in response to an occurrence of a trouble in the exhaust pump. Conversely, the apparatus may be enabled to adjust the air discharge pressure of the hydrostatic bearing 182. Then, the air discharge pressure of the hydrostatic bearing 181 (or the supply voltage to the magnetic bearing) is increased in response to a trouble caused in the exhaust pump. Thus, the gap between the moving block 130 and the second casing 140 rapidly increase. Consequently, similar advantages are obtained. Alternatively, the apparatus may be enabled so that reduction in the air discharge pressure of the hydrostatic bearing 181 and increase in the air discharge pressure of the hydrostatic bearing 182 are simultaneously performed (it is the same with the case of employing the magnetic bearings)

According to the first embodiment, when a trouble occurs in the exhaust pumps P1 and P0 or the piping thereof, the internal pressure of the associated one of the grooves 151 and 152 rises. At least the internal pressure of the groove 153 is still maintained at a negative value. Therefore, a rise in internal pressure of the associated groove is limited nearly to the internal pressure of the groove 153. Consequently, a slight reduction in the degree of vacuum in the process chamber P is inevitable. Then, a second embodiment is obtained by improving the apparatus so as to solve such a problem.

Figure 11:
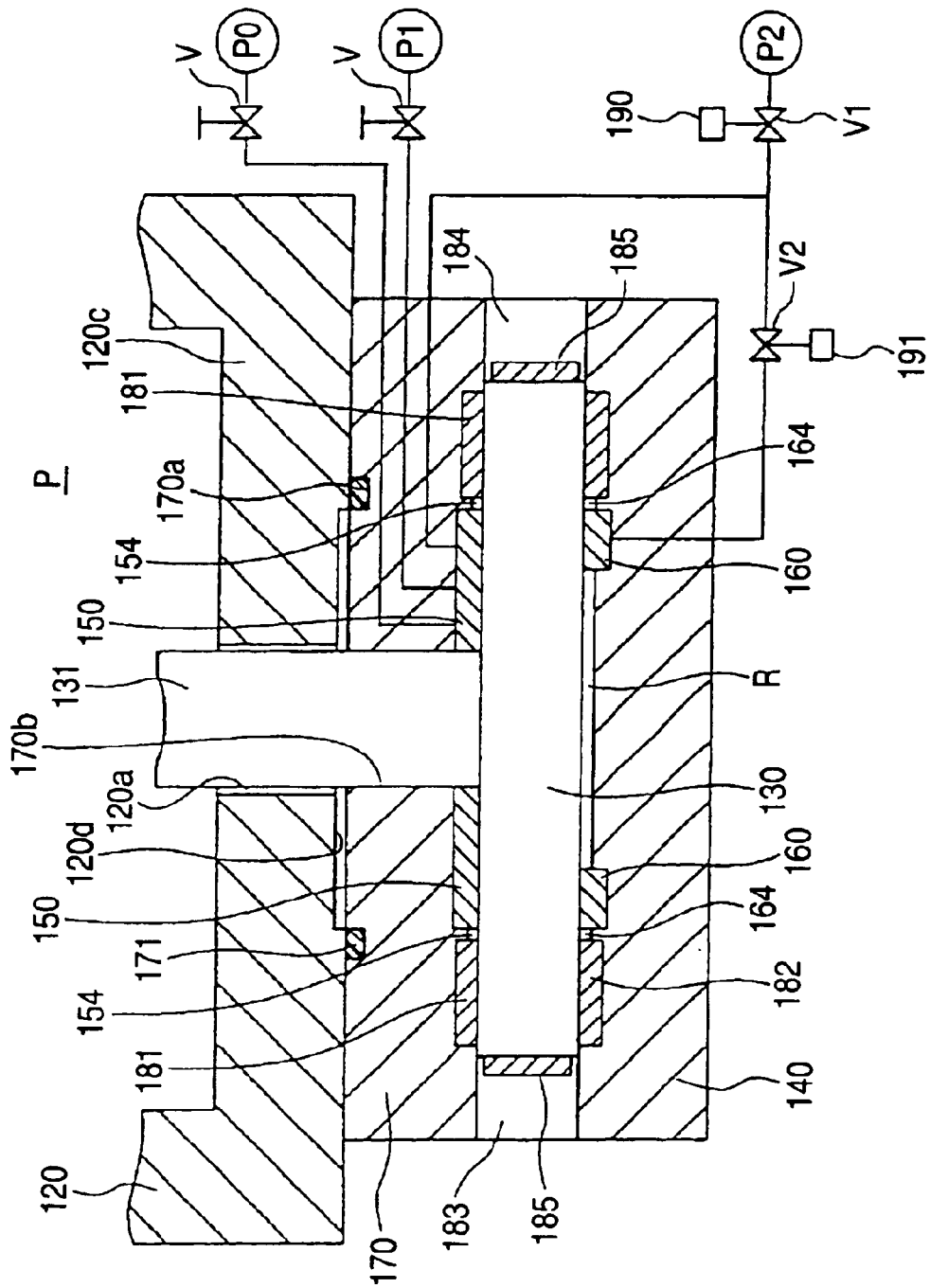
FIG. 11 is a front sectional view illustrating a positioning apparatus according to a second embodiment of the invention.

FIG. 11 is a front sectional view illustrating a second embodiment, which is similar to FIG. 5. The second embodiment differs from the embodiment shown in FIG. 5 only in the position of the valve. The rest of the second embodiment is similar to the associated part of the embodiment illustrated in FIG. 5. Therefore, like constituent elements of the embodiments are designated by like reference character. Thus, the detailed description of such constituent elements is omitted herein.

The difference between these embodiments is more concretely described hereinbelow. As shown in FIG. 11, the valve V2 is formed at a position at which only a sucking operation of the labyrinth seal 160 is interrupted when the valve V2 is driven by the actuator 191 and closed under the control of the control device (not shown). According to the embodiment shown in FIG. 11, when a trouble occurs in one of the exhaust pumps P1 and P0 used for sucking air from the inside of one of the differential pressure seals 150, which is disposed near to the process chamber P, or the piping thereof, the valve V associated with the exhaust pump P1 (or P0) is closed, and the exhaust pump P1 (or P0) is stopped. Moreover, the valve V2 is closed. Then, a sucking operation of the labyrinth seal 160 is interrupted. Thus, the internal pressure of the groove 153 and the internal pressure of one of the grooves 151 and 152, which is associated with the normal exhaust pump are scarcely changed and maintained at a negative value by sucking the inside of the groove 153 at the side of an outermost one of the differential pumping seals 150, and also sucking the inside of the groove associated with a normal one of the exhaust pumps P1 and P0. Although the internal pressure of one of the grooves 151 and 152, which is associated with the abnormal exhaust pump, rises up to a level being almost equal to the voltage of internal pressure of the grooves 153 at worst. However, the internal pressure of the decompression chamber R rises to atmosphere, so that a pressure difference is generated between the top face and the bottom face of the moving block 130, and a space between moving block and intermediate block become small. Thus, the deterioration in the degree of vacuum in the process chamber P can be retarded. During the retardation, countermeasures, such as an operation of tightly sealing the object (by, for example, being partitioned with a gate valve), can be taken. Incidentally, when a trouble occurs in the exhaust pump P2, the apparatus can deal with the trouble, similarly to the case of the first embodiment.

Further, the valve V2 and the actuator 191 are associated with the exhaust pump P2 for exhausting air in the decompression chamber R. Moreover, only the exhaustion of air from the decompression chamber R is stopped by the valve V2 and the actuator 141. In addition to the aforementioned case, each of the aforementioned control device can be used for temporarily reducing the gap between the moving block 3 and the intermediate block 170, alternatively, for bringing both the moving block 3 and the intermediate block 170 into intimate contact with each other. Incidentally, in the second embodiment, similarly as the valves V and V1, a valve adapted to perform only switching between ON and OFF (that is, opened and closed states) is employed as the valve V2 provided at the position at which only an operation of sucking the labyrinth seal 160 is interrupted. Instead of this valve, a valve, such as a needle valve, enabled to perform pressure control operations (that is, flow rate control) may be employed. Especially, when a sucking force acting during ON/OFF control is too large, it is effective to enable the control of the pressure at the side of the decompression chamber R.

Figure 12:
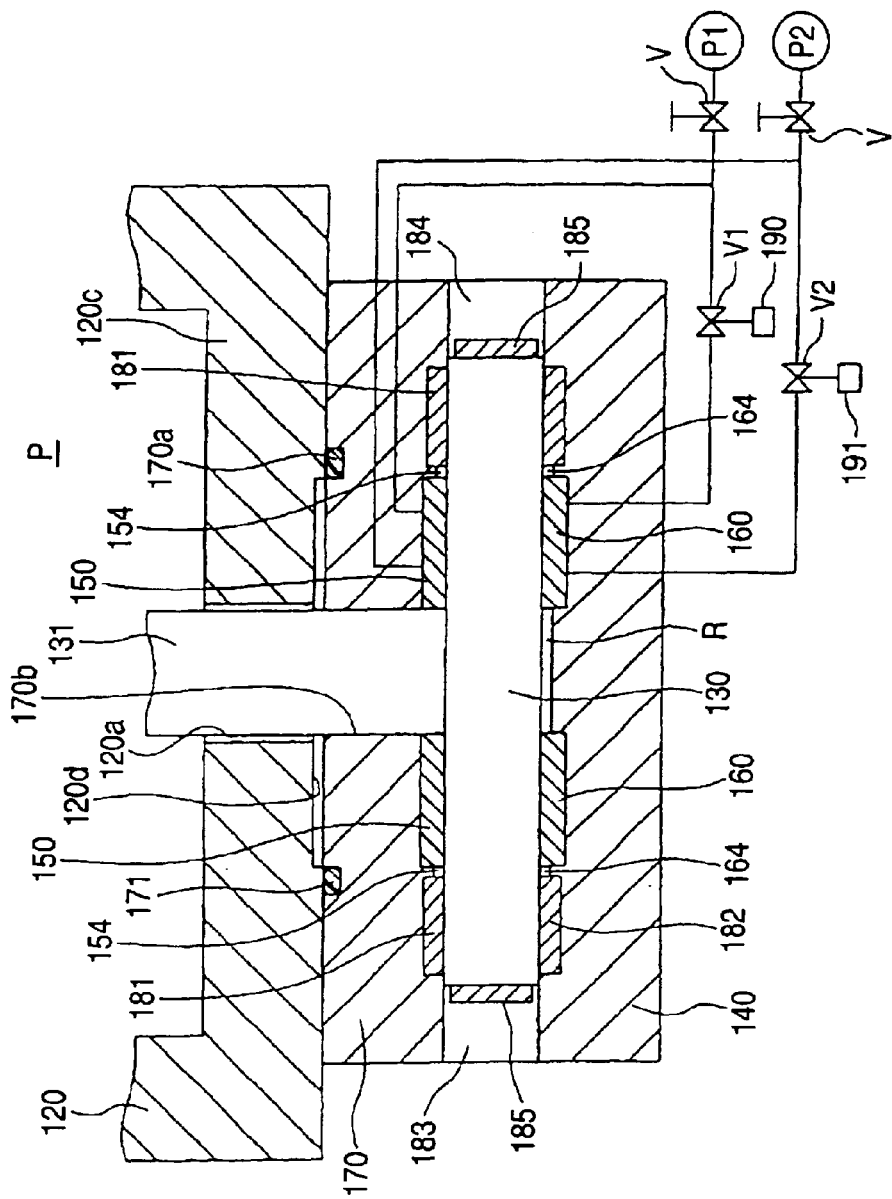
FIG. 12 is a front sectional view illustrating a positioning apparatus according to a third embodiment of the invention.

FIG. 12 is a front sectional view illustrating a third embodiment, which is a similar to FIG. 5. The third embodiment differs from the embodiment shown in FIG. 5 only in that the differential pumping seal 150 at the side of the intermediate block 170 has two stages (that is, the exhaust system-including difference pressure chamber (or grooves) has two stages), that a differential pumping seal 160 which has two stages (that is, second differential pumping seal) similar to the differential pumping seal 150 is provided at the side of the second casing 140, and that mainly the piping system of the differential pumping seal differs from that of the fist and second embodiments. The rest of the third embodiment is similar to the associated part of the embodiment illustrated in FIG. 5. Therefore, like constituent elements of the embodiments are designated by like reference character. Thus, the detailed description of such constituent elements is omitted herein.

The difference between these embodiments is more concretely described hereinbelow. As shown in FIG. 12, the differential pressure chamber of the differential pumping seal 150 provided near to the process chamber P, and the differential pressure chamber of the differential pumping seal 160 provided near side from the decompression chamber R are connected to the same exhaust pump P2, and that the differential pressure chamber of the differential pumping seal 150 provided near to an external portion and, the differential pressure chamber of the differential pumping seal 160 provided near to an external portion, are connected to the same exhaust pump P1. Furthermore, the valves V1 and V2 are formed at a position at which only sucking operations of the differential pumping seal 160 by the exhaust pumps P1 and P2 are interrupted when the valves are driven and closed under the control of the control device (not shown).

According to the embodiment illustrated in FIG. 12, when a trouble occur in the exhaust pump P2 or the piping thereof, the valves V1 and V2 are closed, and a sucking operation of the differential pumping seal 160 is interrupted (by simultaneously closing the valve V at the side of the exhaust pump P2, and stopping the exhaust pump P2). Although the internal pressure of the differential pressure chamber (or groove) provided near to the inner side of the differential pumping seal 150 slightly raises, only the outside of the differential pressure chamber (or groove) near to the external portion of the differential pumping seal 150 is still sucked. The internal pressures of grooves of the two stages of the differential pumping seal 160 become equal to atmosphere pressure. Thus, a pressure difference is caused between the top face and the bottom face of the moving block 130. The gap between the moving block 130 and the intermediate block 170 is narrowed. Consequently, the deterioration in the degree of vacuum in the process chamber P can be retarded. During the retardation, countermeasures, such as an operation of tightly sealing the object (by, for example, being partitioned with a gate valve), can be taken. Incidentally, the reason for closing the valve V2 is to prevent the groove of the differential pumping seal 160, whose internal pressure becomes equal to atmosphere pressure, from communicating with the groove in the differential pumping seal 150.

On the other hand, when a trouble occurs in the exhaust pump P1 or the piping thereof, the valve V at the side of the exhaust pump P1 is closed. The exhaust pump P1 is stopped. Moreover, the valve V2 is closed. Then, when an operation of sucking air in the differential pumping seal 160 is interrupted, only an operation of sucking the inner differential pressure chamber of the differential pumping seal 150 is performed. Thus, a pressure difference is generated between the top face and the bottom face of the moving block 130. Further, the gap between the moving block 130 and the intermediate block 170 is reduced. Consequently, the deterioration in the degree of vacuum in the process chamber P can be retarded. During the retardation, countermeasures, such as an operation of tightly sealing the object (by, for example, being partitioned with a gate valve), can be taken. Incidentally, similarly to the second embodiment, valves each enabled to perform pressure control may be used as the valves V1 and V2 instead of valves adapted to perform only switching between ON and OFF (that is, opened and closed states).

Although not shown, an example of modification of the aforementioned embodiment is adapted when an operation of sucking the inner differential pressure chamber of the inside of the differential pumping seal 150 provided at the side of the process chamber P is performed by a first exhaust pump, when an operation of sucking the outer differential pressure chamber of the differential pumping seal 150 provided at the side of an external portion is performed by a second exhaust pump, when an operation of sucking the differential pumping seal 160 is performed by a third exhaust pump, and even though the valve V1 is formed at a position where only an operation of sucking the differential pumping seal 160 by the third exhaust pump is interrupted in case that the valve V1 is driven and closed by the actuator 190. This modification also operates similar to the third embodiment. Incidentally, it is optional to combine this example of modification with each of the aforementioned embodiments. Further, although the differential pumping seals 150 and 160 are adapted to have two stages, the invention is not limited thereto. For example, the differential pumping seal maybe adapted to have three stages, similarly to the differential pumping seal 150 of the first seal.

Figure 13:
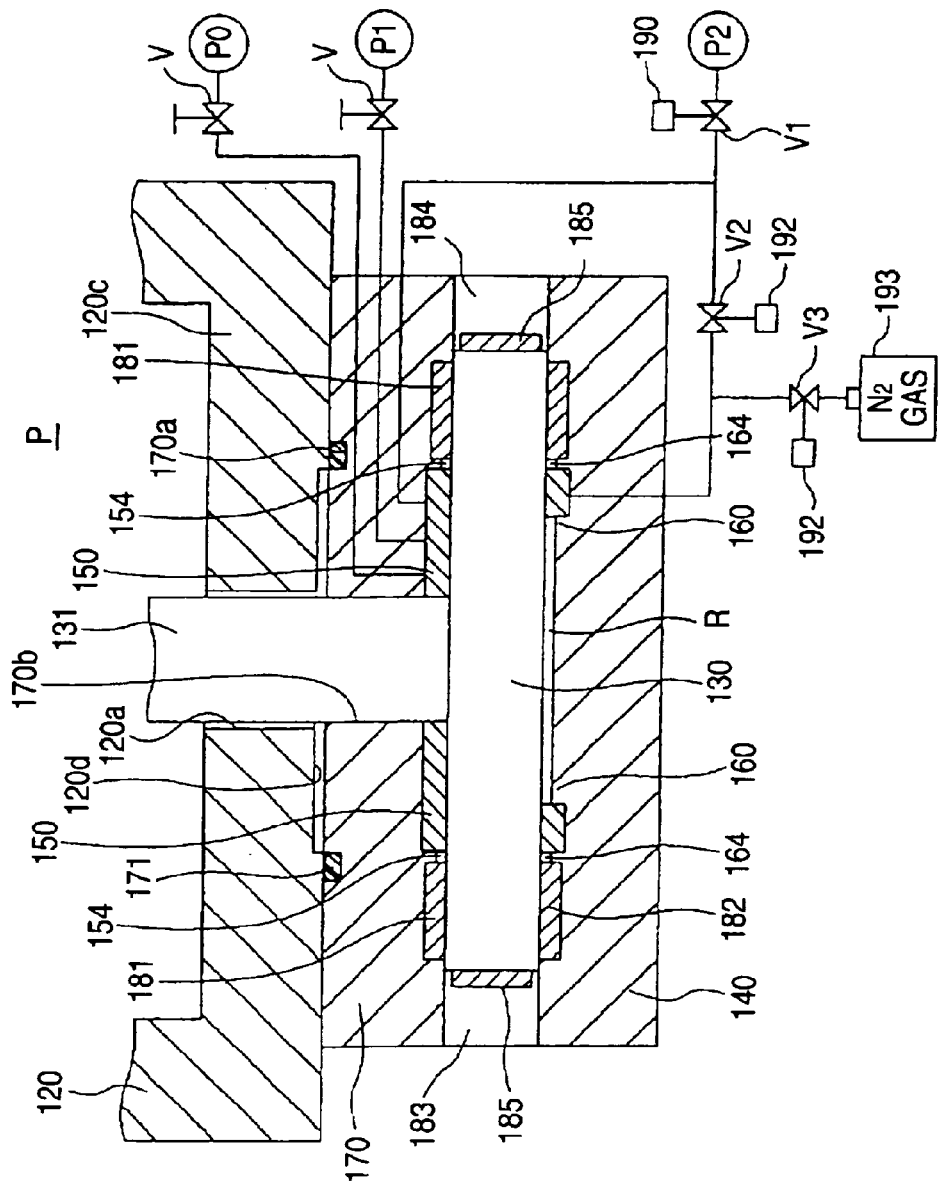
FIG. 13 is a front sectional view illustrating a positioning apparatus according to a fourth embodiment.

FIG. 13 is a front sectional view illustrating a fourth embodiment, which is similar to FIG. 11. The fourth embodiment differs from the embodiment illustrated in FIG. 11 in that a nitrogen gas introducing mechanism is provided in the embodiment shown in FIG. 11. The rest of the fourth embodiment is similar to the associated part of the embodiment illustrated in FIG. 11. Therefore, like constituent elements of the embodiments are designated by like reference character. Thus, the detailed description of such constituent elements is omitted herein.

The difference therebetween is more concretely described hereinbelow. As shown in FIG. 13, piping is branched into branches between the labyrinth seal 160 and the valve V2. The end portion of one of the branches is connected to a steel cylinder 193, which is filled with nitrogen gas under pressure, through a valve V3 adapted to open and close by being driven by an actuator 192 under the control of the control device (not shown). Incidentally, in an ordinary operating condition, the valve V3 is in a closed state. Thus, nitrogen gas stored in steel cylinders is not supplied to the positioning apparatus.

According to the embodiment illustrating FIG. 13, when a trouble occurs in the exhaust pump P1 used for sucking one of the differential pressure chambers of the differential pumping seal 150, which is provided at the side of the process chamber P, (that is, nearest to the process chamber P) or the piping thereof, the valve V2 is closed and the valve 3 is opened (while the valve V associated with the exhaust pump P1 is closed and the exhaust pump P1 is stopped). Thus, when an operation of sucking the differential pumping seal 160 is interrupted, an operation of sucking only the differential exhaust valve V3, which is provided at an external portion side, a pressure difference is generated between the top face and the bottom face of the moving block 130. Moreover, the gap between the moving block 130 and the intermediate block 170 is reduced. Consequently, the deterioration in the degree of vacuum in the process chamber P can be retarded. During the retardation, countermeasures, such as an operation of tightly sealing the object (by, for example, being partitioned with a gate valve), can be taken. Especially, in this embodiment, the valve V3 is put into an opened state. Thus, nitrogen gas contained in the steel cylinder 193 can quickly be introduced to the inside of the groove 161, which is provided at the side of the labyrinth seal 160, and thus, into the decompression chamber R. Therefore, the internal pressure of the decompression chamber R can quickly been increased to, for instance, atmospheric pressure. Incidentally, it is more preferable that a valve enabled to perform pressure control is used as the valve V3 to be connected to the steel cylinder 193. In the above-mentioned respective first to fourth embodiments, when a trouble arises in the exhaust system, the control unit performs an operation to decrease the gap between the moving block 130 and the intermediate block 170 (hereinafter referred to as "gap control operation"). Here, depending on a case, there also exists a possibility that the moving block 130 and the intermediate block 170 come into contact with each other. Further, the description is also made with respect to the effective suppression of the intrusion of gas into the process chamber by positively bringing both of the moving block 130 and the intermediate block 170 into the intimate contact with each other.

However, for example, when the moving block 130 comes into contact with the intermediate block 170 during the movement thereof, a friction is generated between both of the moving block 130 and the intermediate block 170 thus giving rise to an situation.

Accordingly, to cope with the situation, in addition to the constitutions of the first to the fourth embodiments, it is preferable to provide a function which brings the moving block 130 into an emergency stop. That is, it is preferable that the control device brings the moving block 130 into the emergency stop prior to the gap control operation which is illustrated in the explanation of the above-mentioned respective embodiments.

To be more specific, for example, as a motor which constitutes a drive part for driving the moving block 130, a motor which includes a dynamic brake is used. Then, when a trouble occurs in the exhaust system, the control unit, first of all, performs braking of the moving block 130 using the dynamic brake. However, for example, when a non-contact type guiding device such as the hydrostatic bearing is used for supporting the moving block 130 and a brushless linear motor is used as a motor of the drive part, there may be some case that it is difficult to completely stop the moving block 130 using only the dynamic brake. For example, there may be cases in which a reaction from the cable guides acts in response to the position of the moving block (particularly, when the moving block being positioned at a stroke end) and hence, the moving block which should be stopped gently moves. When the moving block 130 cannot be stopped completely, it is preferable to perform the gap control operation at a stage in which the moving block 30 is set to a sufficiently low speed.

Figure 14:
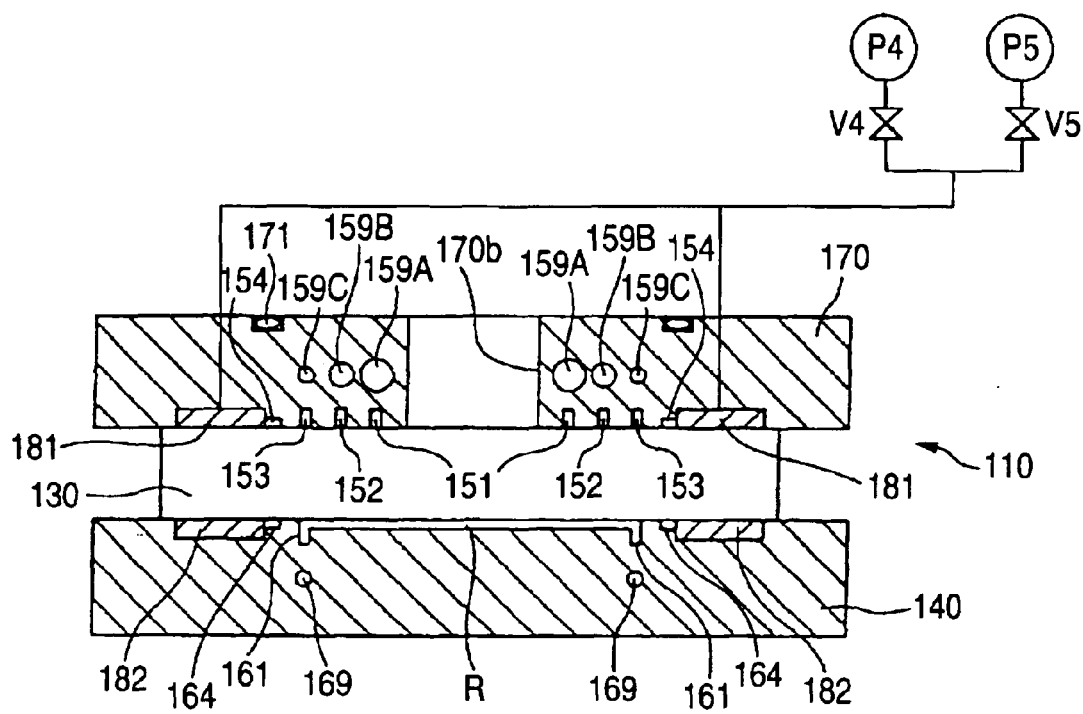
FIG. 14 is a schematic view illustrating the configuration of a positioning apparatus for explaining fifth embodiment.

As has been described in the first embodiment, by adopting the constitution shown in FIG. 14 thus enabling the coupled use of the suction from the bearing surface of the hydrostatic bearing 181 using the exhaust pump, it is possible to bring the moving block 130 and the intermediate block 170 into intimate contact with each other. That is, in a usual operation, when the valve V4 is opened, the valve V5 is closed and the positive pressure pump P4 are operated so that air is supplied to the hydrostatic bearing 181 and the gap is held between the moving block 130 and the intermediate block 170. On the other hand, at the time of performing the gap control operation, with the use of the control unit, the valve V4 is closed, the valve VS is opened and the exhaust pump P5 is operated so that the bearing surface of the hydrostatic bearing 181 is brought into negative pressure and the moving block 130 is sucked. Accordingly, no repulsive force acts between the moving block 130 and the intermediate block 170 and only the suction force acts between them whereby both of the moving block 130 and the intermediate block 170 are brought into intimate contact with each other.

However, it is more preferable that the gap control operation is performed after the moving block 130 is completely stopped. To this end, it is preferable, in addition to add the dynamic brake, that is, to provide a friction type brake shown in FIG. 15 and FIG. 16.

Figure 15:
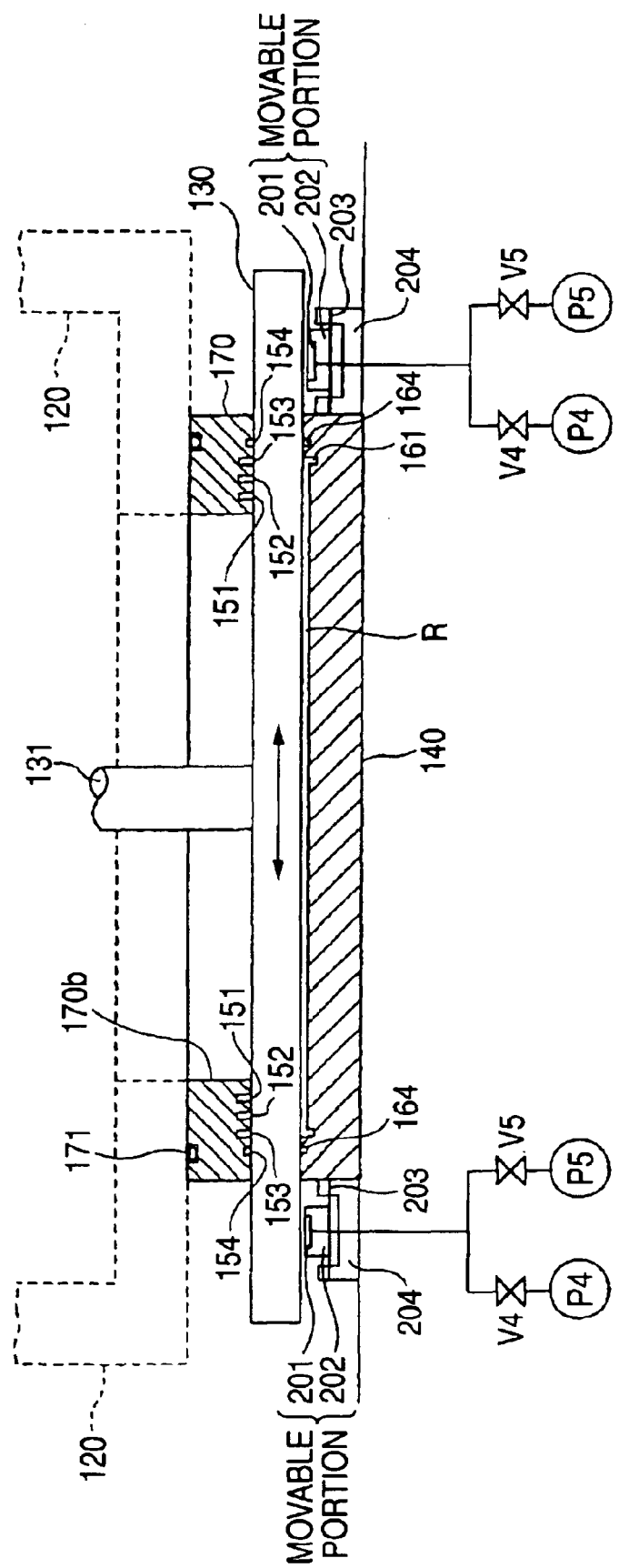
FIG. 15 is a sectional view illustrating the configuration of a positioning apparatus according to the sixth embodiment.
Figure 16:
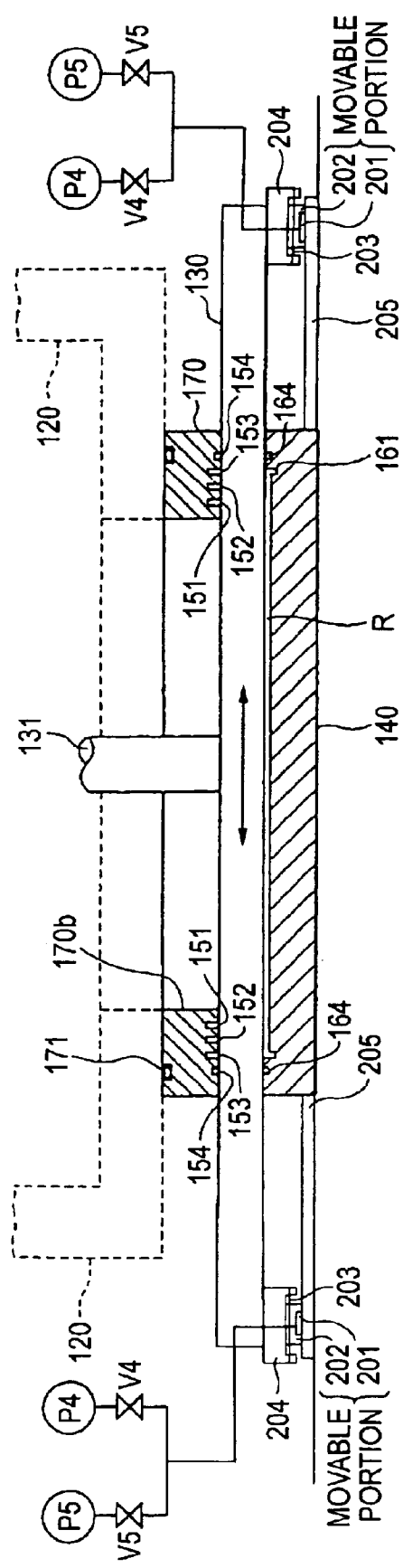
FIG. 16 is a sectional view illustrating the configuration of a positioning apparatus according to the seventh embodiment.

In FIG. 15 and FIG. 16, the friction type brake is configured to support a movable part having a porous pad 201 and a housing 202 which holds the pad 201 on a fixed portion 204 by a leaf spring 203. In performing the usual operation, by blowing off air from the positive pressure pump P4 to an opposing surface of a counterpart member of the pad 201 (the moving block 130 in FIG. 15 and a brake plate 205 fixed to a base in FIG. 16), a gap of several μm is defined between the pad 201 and the counterpart member.

In performing the gap control operation, at a stage that the moving block 130 is set to a sufficiently low speed with the use of the dynamic brake, in the same manner as the case explained in FIG. 14, the valves are changed over to operate the exhaust pump P5. Accordingly, the counterpart member is sucked and is brought into intimate contact with the surface of the pad 201 so that the moving block 130 can be completely stopped. Thereafter, by performing the operation to narrow the gap between the moving block 130 and the intermediate block 170, it is possible to prevent the generation of a friction between both of the moving block 130 and the intermediate block 170.

Here, the movable part is held in a state that the pad 201 is pushed to the counterpart member when air is not blown off from the pad 201. That is, the leaf spring 203 assumes a state in which the leaf spring 203 is resiliently deformed. However, a resilient force of the leaf spring 203 is sufficiently small compared to the pressure of air blown off from the surface of the pad 201 and hence, the gap is held between the pad 201 and the counterpart member in the state that air is blown off from the pad 201. On the other hand, when air is not blown off from the pad 201, the pad 201 assumes a state in which the pad is pushed to the counterpart member. However, in addition to such a provision, a strong braking force is obtained by sucking air from the surface of the pad 201.

An advantage of the constitution shown in FIG. 15 lies in that the friction type brake is arranged at the base side and hence, it is possible to prevent piping to the pad 201 from moving together with the moving block 130. On the other hand, an advantage of the constitution shown in FIG. 16 lies in that a blake plate 205 can be easily exchanged.

Although the movable part is supported by the leaf spring 203 in the examples shown in FIG. 15 and FIG. 16, it may be possible to adopt, for example, a constitution in which the movable part can be reciprocated by a pneumatic cylinder and the separation/intimate contact is changed over by the actuation of the pneumatic cylinder.

Although the invention has been described in the foregoing description by referring to the embodiments, the invention should not be limited thereto. Needless to say, appropriate modifications and improvements can be made. For instance, the number of the groove portions of the differential pumping seal 150 and the differential pumping seal 160 are set to be 3 or 2. However, the invention is not limited thereto without departing from the spirit of the invention. According to the number of grooves may be equal performance of a suction pump, and to the pressure difference between the inside and the outside of the process chamber, four or more rows of grooves may be provided. Further, the number of rows of grooves in the differential pumping seal 160 may be set to be less than the number of rows of grooves of the differential pumping seal 150. For instance, the number of rows of grooves in the differential pumping seal 160 may be set to be 1. In this case, in view of a balance of sucking forces applied to the moving block, it is preferable that outermost grooves of the differential pumping seals 150 and 160 are provided across the moving block at corresponding positions along the moving block to be opposed to each other. The size of the gap between the first casing 120 and the intermediate block is determined according to the performance of a suction pump, and may appropriately be selected from several μm to hundreds μm. Furthermore, the bearings are not limited to a linear guide, and a hydrostatic bearing. Various kinds of bearings, for example, a cross roller guide, and a roller bearing, may be used. Further, although the groove portion for positioning an O-ring is provided at the side of the intermediate block, the O-ring may be provided at the side of the first casing, or both the intermediate block and the first casing. Additionally, various combinations of the configurations described in "Means for Solving the Problems" may be employed.

ADVANTAGE OF THE INVENTION

According to the invention, the gap between the moving block and the first casing is reduced to a small value, so that when some trouble occurs in the exhaust pump or in the piping thereof, deterioration of the degree of vacuum in the process chamber can be retarded. During a retarded time, measures to protect an object to be processed, which is being processed, can be taken.

What is claimed is:

1. A positioning apparatus, comprising:
   a process chamber exposed under reduced pressure;
   a first casing having a first guide face that has a first opening communicating with inside of the process chamber;
   a moving block movable in at least one direction and opposed to said first guide face through a predetermined gap;
   a second casing including:
   a second guide face being on the other side of the moving block via the moving block, and guiding in a state that the second guide face is opposed to the moving block through a predetermined gap; and a decompression chamber whose internal pressure is lower than a pressure of an outside of the process chamber;

a first differential pumping seal including a plurality of stages, provided between the first casing and the moving block to surround the first opening and sealing between an inside of the process chamber and an outside of said process chamber, wherein a pressure of the outside of the process chamber is higher than that of the inside of the process chamber; and a seal mechanism for maintaining an inside of the decompression chamber at a pressure that is lower than that of an outside of the decompression chamber, wherein a stage of the first differential pumping seal, which is most far from said process chamber, and the inside of the decompression chamber are connected to a same exhaust source.

2. The positioning apparatus according to claim 1, wherein the moving block is supported with respect to said first casing and said second casing by a hydrostatic bearing or a magnetic bearing.

3. The positioning apparatus according to claim 2, wherein the hydrostatic bearing or the magnetic bearing are adjustable to support the moving block with respect to said first casing and said second casing.

4. A positioning apparatus, comprising:

a process chamber exposed under reduced pressure;

a first casing having a first guide face that has a first opening communicating with inside of the process chamber;

a moving block movable in at least one direction and opposed to said first guide face through a predetermined gap;

a second casing including:
  a second guide face being on the other side of the moving block via the moving block, and guiding in a state that the second guide face is opposed to the moving block through a predetermined gap; and
  a decompression chamber whose internal pressure is lower than a pressure of an outside of the process chamber;

a first differential pumping seal including a plurality of stages, provided between the first casing and the moving block to surround the first opening and sealing between an inside of the process chamber and an outside of said process chamber, wherein a pressure of the outside of the process chamber is higher that that of the inside of the process chamber; and a seal mechanism for maintaining an inside of the decompression chamber at a pressure that is lower than that of an outside of the decompression chamber, wherein control device controls the gap between the first guide face and the moving block in accordance with an operating condition of at least one of the first differential pumping seal and the seal mechanism.

5. The positioning apparatus according to claim 4, wherein the seal mechanism is a second differential pumping seal which is provided on opposed faces of said second guide surface and said moving block, wherein the second differential pumping seal seals between the inside of the decompression chamber and the outside of the decompression chamber, and wherein the control device controls an internal pressure of piping, through which the first and second exhaust seals are connected to an exhaust sources.

6. The positioning apparatus according to claim 4, wherein the first differential pumping seal has two or more stages, wherein the second differential pumping seal has a single stage, and wherein one of the stages of the first differential pumping seal, which is most far from said process chamber, and said second differential pumping seal are connected to a same exhaust source.

7. The positioning apparatus according to claim 5, wherein the first differential pumping seal has two or more stages, wherein the second differential has a single stage, and wherein one of the stages of the first differential pumping seal, which is most far from said process chamber, and said second differential pumping seal are connected to a same exhaust source.

8. The positioning apparatus according to claim 4, wherein the moving block is supported with respect to said first casing and said second casing by a hydrostatic bearing or a magnetic bearing.

9. The positioning apparatus according to claim 5, wherein the moving block is supported with respect to said first casing and said second casing by a hydrostatic bearing or a magnetic bearing.

10. The positioning apparatus according to claim 8, wherein the hydrostatic bearing or the magnetic bearing are adjustable to support the moving block with respect to said first casing and said second casing.

* * * * *